(12) United States Patent
Voo

(10) Patent No.: US 7,345,544 B1
(45) Date of Patent: Mar. 18, 2008

(54) METHOD AND APPARATUS FOR COMMON MODE CONTROL

(75) Inventor: Thart Fah Voo, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/444,240

(22) Filed: May 30, 2006

Related U.S. Application Data

(63) Continuation of application No. 10/795,023, filed on Mar. 5, 2004, now Pat. No. 7,088,181.

(51) Int. Cl.
*H03F 3/45* (2006.01)

(52) U.S. Cl. .................................. 330/258; 330/259
(58) Field of Classification Search ................ 330/258, 330/259, 9, 253, 257, 260
See application file for complete search history.

(56) References Cited

U.S. PATENT DOCUMENTS

| | | | |
|---|---|---|---|
| 3,982,196 A * | 9/1976 | Poujois | 330/9 |
| 5,180,932 A * | 1/1993 | Bengel | 327/362 |
| 5,281,924 A | 1/1994 | Maloberti et al. | |
| 5,847,607 A | 12/1998 | Lewicki et al. | |
| 5,942,942 A * | 8/1999 | Wang | 330/258 |
| 6,121,843 A | 9/2000 | Vampola et al. | |
| 6,400,220 B1 | 6/2002 | Wang et al. | |
| 6,411,166 B2 | 6/2002 | Bashirotto et al. | |
| 6,617,926 B2 | 9/2003 | Casper et al. | |
| 6,812,784 B2 * | 11/2004 | Michalski | 330/9 |
| 6,888,407 B2 | 5/2005 | Ramazan et al. | |

* cited by examiner

*Primary Examiner*—Henry Choe

(57) ABSTRACT

A common mode feedback circuit is provided that can set a direct voltage operating point of the outputs of an associated amplifier. The common mode feedback circuit can remain powered on during power down of the associated amplifier and maintain a large feedback loop capacitance (in the common mode feedback circuit) at an approximately normal operating voltage to advantageously reduce settling time of an associated amplifier that has been powered off.

20 Claims, 4 Drawing Sheets

METHOD AND APPARATUS FOR COMMON MODE CONTROL

BACKGROUND

This application is a continuation (and claims the benefit of priority under 35 USC 120) of U.S. application Ser. No. 10/795,023, now U.S. Pat. No. 7,088,181 filed Mar. 5, 2004. The disclosure of the prior application is considered part of (and is incorporated by reference in) the disclosure of this application.

The following disclosure relates to electrical circuits.

Differential amplifiers are useful circuits for a variety of applications. For example, a differential amplifier can be implemented as a wideband transimpedance amplifier within a high speed (e.g., a 10 GHz) communication system. Differential amplifiers typically include a common mode feedback (CMFB) circuit. The CMFB circuit operates to stabilize an associated differential amplifier—i.e., set a direct voltage (DC) operating point at the output of the differential amplifier.

FIG. 1 illustrates a conventional CMFB circuit 100 for a differential amplifier 102. CMFB circuit 100 includes an error amplifier A1 that compares a common mode voltage (as measured at node 104) to a reference voltage $V_{REF}$. Error amplifier A1 adjusts the common mode voltage by supplying a feedback voltage 106 to the gates of resistive current mirror transistors M14, M15, M16, M17. For example, as the common mode voltage increases, error amplifier A1 increases feedback voltage 106 being supplied to the gates of resistive current mirror transistors M14, M15, M16, M17. Less current, therefore, flows through resistive current mirror transistors M14, M15, M16, M17. As a result, more current flows through resistors R1, R2 and the output voltage of differential amplifier 102 (and the common mode voltage) decreases. The feedback path of error amplifier A1 passes from the output of error amplifier A1 to the gates of resistive current mirror transistors M14, M15, M16, M17, through the outputs of wideband amplifier 102, and back to a positive input of error amplifier A1.

A switch 108 can be used to turn off differential amplifier 102 during a power down mode, for example, to save power consumption. Switch 108 can be implemented with a CMOS transmission gate. As noted above, the feedback path of CMFB circuit 100 passes through circuitry of differential amplifier 102. Thus when differential amplifier 102 is powered off (e.g., by opening switch 108), CMFB circuit 100 is also typically powered off. The direct voltage (DC) operating point at the output of the differential amplifier is not retained as the feedback of CMFB circuit 100 path ceases to exist (even if error amplifier A1 remains on).

A typical problem associated with switching a differential amplifier on and off is the differential amplifier may exhibit a relatively long settling time due to the feedback path of a CMFB circuit. The long settling time is due to error amplifier A1 having to charge a relatively large feedback loop capacitance $C_L$. The long settling time can degrade performance of the differential amplifier, particularly if a loop gain of the CMFB circuit 100 is relatively large.

SUMMARY

In general, in one aspect, this specification describes an amplifier. The amplifier includes an input stage configured to receive an input. An amplification stage is coupled to the input stage, and is configured to amplify the input and generate a differential amplified output. The differential amplified output has an associated common mode voltage level. A common mode feedback circuit is coupled to the amplification stage, and is configured to control the common mode voltage level through a feedback loop. The feedback loop is configured such that the feedback loop is independent from the amplification stage.

Particular implementations may include one or more of the following features. The input can be a single-ended or differential input. The amplifier can further include a switch operable to decouple the common mode feedback circuit from the amplification stage. The feedback loop can include an error amplifier. The error amplifier can be configured to compare a reference voltage to an operating voltage of a node in the common mode feedback circuit, and supply a feedback voltage to the amplification stage based on the comparison to control the common mode voltage level. The operating voltage of the node in the common mode feedback circuit can be independent from the amplification stage of the amplifier.

The amplifier can further include a current mirror. The current mirror can be configured to bias the common mode feedback circuit with a current similar to a current in the amplification stage of the amplifier. The current mirror can be configured to bias the common mode feedback circuit with a lower current than the amplification stage of the amplifier. The current mirror cane be configured to bias the common mode feedback circuit substantially as follows:

$$I_C = \frac{I_O}{k},$$

where $I_C$ represents bias current for the common mode feedback circuit, and $I_O$ represents bias current for the amplification stage of the amplifier, and k is a predetermined ratio.

In general, in another aspect, this specification describes a disk drive system. The disk drive system includes a read/write head configured to sense changes in magnetic flux on a surface of a disk and generate a corresponding analog signal, a preamplifier configured to amplify the analog signal, and a read channel configured to receive the amplified analog signal and generate a digital read signal based on the amplified analog signal. The preamplifier includes an input stage configured to receive the analog signal, an amplification stage coupled to the input stage, and configured to amplify the analog signal and generate an amplified analog signal. The amplified analog signal has an associated common mode voltage level. The preamplifier further includes a common mode feedback circuit coupled to the amplification stage, that is configured to control the common mode voltage level through a feedback loop. The feedback loop is configured such that the feedback loop is independent from the amplification stage.

In general, in another aspect, this specification describes a common mode feedback circuit for indirectly controlling a common mode voltage level at an output of an associated amplifier. The common mode feedback circuit includes a feedback loop. The feedback loop includes an error amplifier configured to compare a reference voltage to a voltage at a node in the feedback loop and generate a feedback voltage based on the comparison. The error amplifier is further configured to send the feedback voltage to a feedback transistor in the feedback loop. The feedback transistor is configured to receive the feedback voltage and adjust the voltage at the node in the feedback loop, in which the voltage at the node in the feedback loop is independent from an amplifier associated with the common mode feedback circuit.

Particular implementations may include one or more of the following features. The error amplifier can be further configured to send the feedback voltage to a resistive current mirror transistor of an associated amplifier. The resistive transistor can be configured to receive the feedback voltage and adjust the common mode voltage level at an output of the associated amplifier. The feedback loop can be configured such that the feedback loop is independent from an associated amplifier. The resistive current mirror transistor can have a larger width-to-length ratio than the feedback transistor.

In general, in another aspect, this specification describes a method for switching a differential amplifier. The differential amplifier include a feedback circuit to control a common mode voltage of the differential output. The method includes powering off the differential amplifier, decoupling the feedback circuit from the differential amplifier, and powering on the feedback circuit on while the differential amplifier is powered off.

Particular implementations may include one or more of the following features. The feedback circuit can be configured to maintain a feedback loop capacitance at approximately an operating voltage level while the differential amplifier is powered off. The method can further include recoupling the feedback circuit to the differential amplifier and powering on the differential amplifier, whereby the differential amplifier has a reduced settling time due to the feedback loop capacitance being at approximately an operating voltage level.

In general, in another aspect, this specification describes a method for controlling a common mode voltage level associated with an output of a differential amplifier. The method includes amplifying an input signal and generating an amplified output signal. The amplified output signal has an associated common mode voltage level. The method further includes generating a common mode feedback voltage through a feedback loop, in which the common mode feedback voltage controls the common mode voltage level. The feedback loop is independent from the amplified output signal. The method further includes adjusting the common mode voltage level based on the common mode feedback voltage, discontinuing amplification of the input signal, and continuing to generate the feedback voltage through the feedback loop.

Implementations may provide one or more of the following advantages. A common mode feedback circuit is provided that can set a direct voltage operating point of the output of an associated differential amplifier. A circuit is provided that includes a feedback path for the common mode feedback circuit that is independent of the associated differential amplifier. The common mode feedback circuit can remain powered on during power down of the associated differential amplifier and maintain a large feedback loop capacitance (in the common mode feedback circuit) at an approximately normal operating voltage to advantageously reduce settling time of the associated differential amplifier. The effect of the large feedback loop capacitance on the settling time of the associated differential amplifier is reduced. A loop gain of the feedback path of the common mode feedback circuit is smaller relative to a conventional feedback path, as the gain of the feedback path does not include gain of the associated differential amplifier. A smaller loop capacitance is, therefore, required to stabilize the feedback loop.

The details of one or more implementations are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

Figure 1:
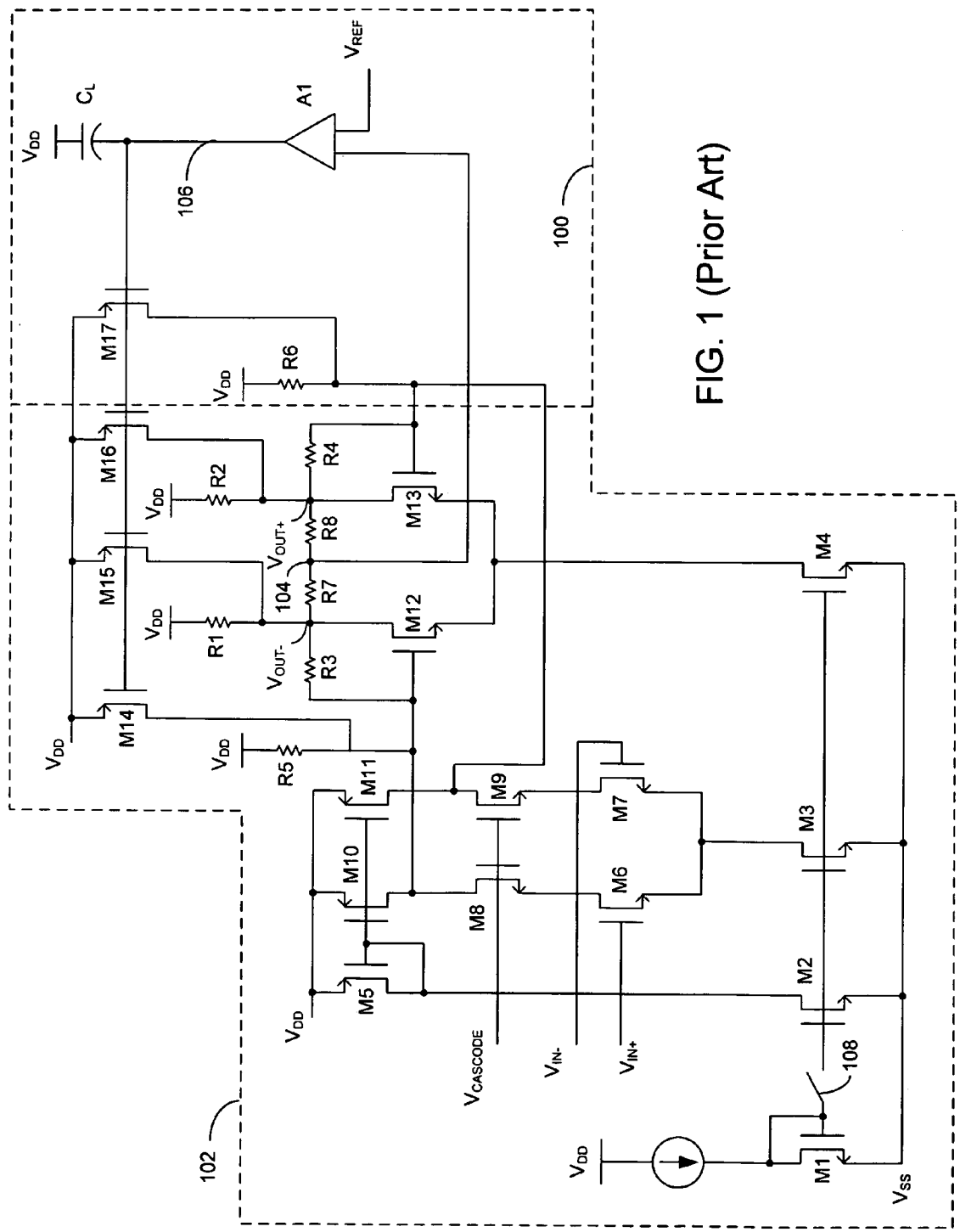
FIG. 1 is a schematic diagram of a conventional common mode feedback circuit and a differential amplifier.
Figure 2:
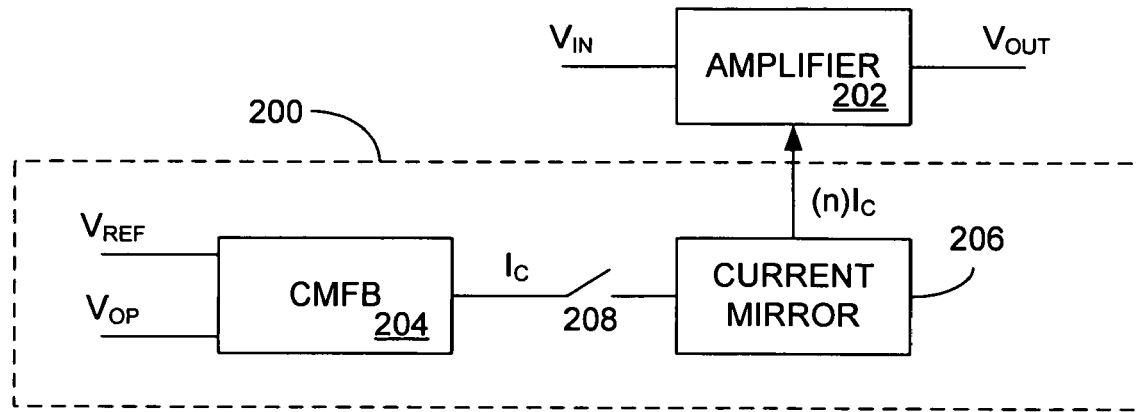
FIG. 2 is a block diagram of common mode feedback circuit and a differential amplifier.

FIG. 2 shows a block diagram of a feedback system 200 operable to set a direct voltage (DC) operating point at the output of a differential amplifier 202. Differential amplifier 202 is an amplifier that has at least a differential output. For example, differential amplifier 202 can be a single-ended to differential converter, a differential analog-to-digital (ADC) driver, a differential charge pump, a transimpedance amplifier, a sample and hold amplifier, a differential transmitter and receiver, and other similar structures. In one implementation, differential amplifier 202 receives a single-ended or differential input voltage $V_{IN}$ and outputs a differential voltage $V_{OUT}$. More generally, differential amplifier 202 can receive an input voltage or current (single-ended or differential) and output a differential voltage or a differential current.

Feedback system 200 includes a common mode feedback (CMFB) circuit 204 and a current mirror 206. In one implementation, CMFB circuit 204 includes an error amplifier (not shown) that compares a reference voltage $V_{REF}$ to a (steady state) operating voltage $V_{OP}$ of a node (not shown) within CMFB circuit 204. The node within CMFB circuit 204 can be independent from differential amplifier 202. Unlike a conventional CMFB circuit, the error amplifier does not compare a common mode output voltage of an associated differential amplifier with a reference voltage. Thus, a feedback path (not shown) of the error amplifier is independent from (i.e., does not pass through circuitry) of differential amplifier 202.

The error amplifier sets a direct voltage (DC) operating point at outputs of a differential amplifier 202 by maintaining a current $I_C$ flowing through a feedback transistor (not shown) within feedback system 200 at a predetermined ratio with respect to current flowing through output transistors (not shown) of differential amplifier 202. Current mirror 206 reflects current $I_C$ through the output transistors of differential amplifier 202 such that current flowing through the output transistors of differential amplifier 202 is approximately equal to $k(I_C)$, where k is the predetermined ratio. In one implementation, the predetermined ratio k is set by an appropriate scaling between transistor sizes (i.e., width-to-length ratios) of one or more feedback transistors (not shown) in CMFB circuit 204 relative to one or more resistive current mirror transistors (not shown) of differential amplifier 202.

As discussed above, the feedback path of the error amplifier is independent from differential amplifier 202. CMFB circuit 204 can, therefore, be decoupled from differential amplifier 202 and remain powered on (e.g., using switch 208) during times that differential amplifier 202 is powered off. CMFB circuit 204 remains powered on to maintain a feedback loop capacitance (not shown) within CMFB circuit 204 at an approximately normal operating voltage. In one implementation, a switch 208 decouples CMFB circuit 204 from differential amplifier 202.

Figure 3:
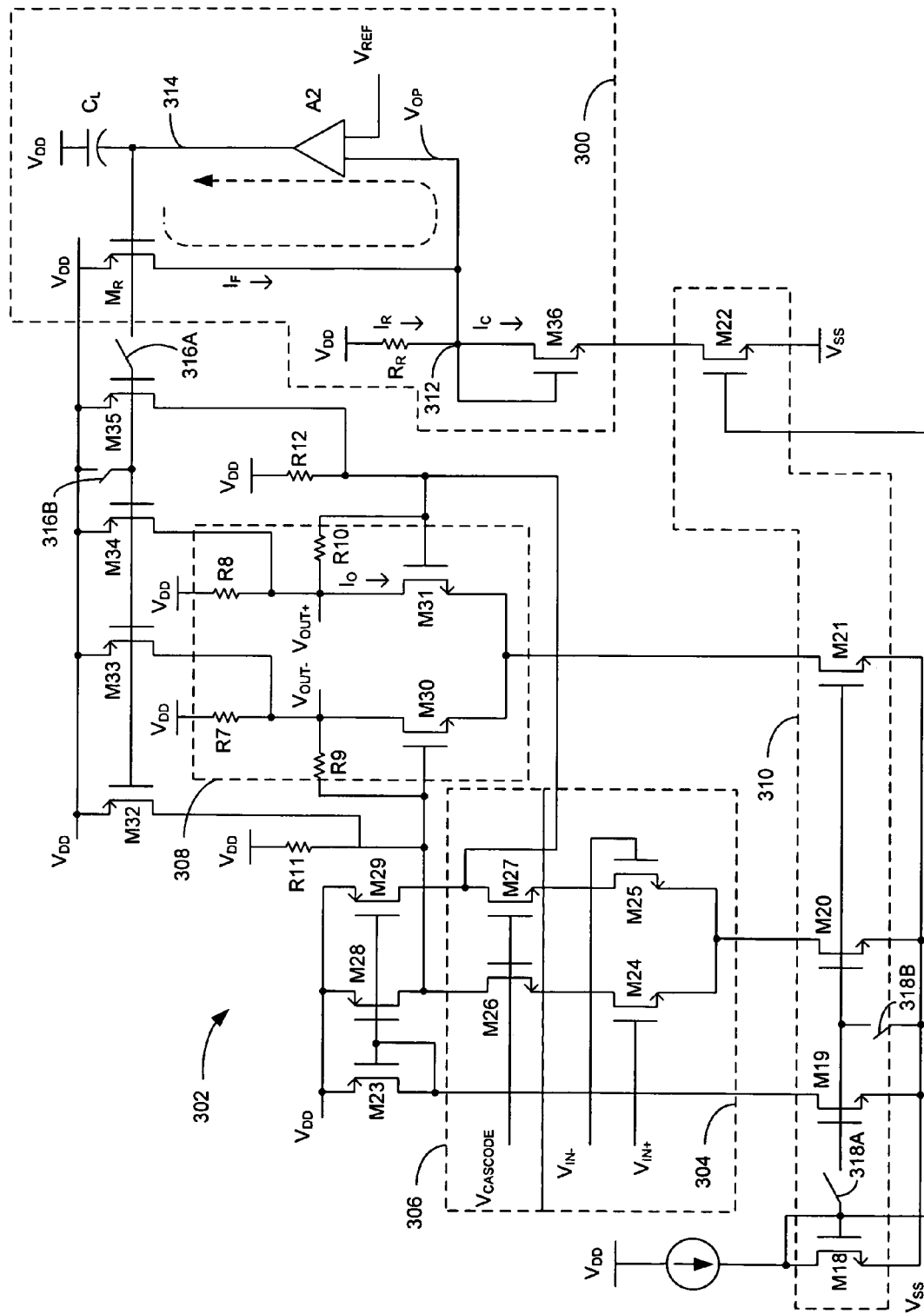
FIG. 3 is a schematic diagram of a common mode feedback circuit and a wideband transimpedance amplifier.

FIG. 3 illustrates one implementation, of CMFB circuit 300 and an associated (two-stage) wideband transimpedance amplifier 302. Wideband transimpedance amplifier 302 includes an input stage 304, a cascode gain stage 306, an output stage 308, and a current mirror 310. Cascode gain stage 306 and output stage 308 can form an amplification stage for wideband transimpedance amplifier 302. Input stage 304 includes transistors M24, M25, connected as a differential pair. Input stage 304 receives a differential input (e.g., differential input voltages $V_{IN+}$, $V_{IN-}$).

Cascode gain stage 306 includes transistors M26, M27. Transistors M26, M27 receive a control voltage $V_{CASCODE}$. Transistors M26, M27 provide a low input impedance to support a larger bandwidth, and provide a high output impedance to achieve a better gain Output stage 308 includes transistors M30, M31 and resistors R7, R8. Output stage 308 generates a differential output (e.g., differential output voltages $V_{OUT+}$, $V_{OUT-}$) from the amplified differential input (e.g., differential input voltages $V_{IN+}$, $V_{IN-}$). Wideband transimpedance amplifier 302 also includes resistive current mirror transistors M32, M33, M34, M35. Current mirror 310 includes transistors M18, M19, M20, M21, M22. Transistors M19, M20, M21, M22 are current sources that mirror current from transistor M18.

CMFB circuit 300 includes an error amplifier A2, a first feedback transistor $M_R$, a second feedback transistor M36, and a resistor $R_R$. Error amplifier A2 maintains a current $I_C$ (flowing through second feedback transistor M36) at a steady state operating level. The steady state operating level of current $I_C$ can be determined based on application design requirements. In one implementation, the steady state operating level of current $I_C$ is biased through transistor M22 of current mirror 310. Current $I_C$ can be represented as follows:

$$I_C = I_R + I_F \quad \text{(eq. 1)}$$

where $I_R$ is the current flowing through resistor $R_R$ and $I_F$ is a feedback current flowing in the feedback loop of error amplifier A2.

In one implementation, error amplifier A2 maintains current $I_C$ by comparing a reference voltage $V_{REF}$ to an operating voltage $V_{OP}$ at a junction between resistor $R_R$ and second feedback transistor M36, referred to herein as node 312. $V_{OP}$ can be represented as follows:

$$V_{OP} = V_{DD} - (I_R * R_R) \quad \text{(eq. 2)}$$

where $V_{DD}$ is a power supply voltage (e.g., 5V). Based on the comparison of reference voltage $V_{REF}$ to operating voltage $V_{OP}$, error amplifier A2 supplies a feedback voltage 314 to the gate of first feedback transistor $M_R$, which in response passes a feedback current $I_F$ that can be combined with a current $I_R$ (flowing through resistor $R_R$) to maintain current $I_C$ at a steady state operating level. Current $I_C$ is a bias current maintained by transistor M22 of current mirror. In one implementation, the feedback path of error amplifier A2 is from the output of error amplifier A2 to the gate of first feedback transistor $M_R$ and back to a positive input of error amplifier A2.

As the feedback path of error amplifier A2 does not pass through circuitry of wideband transimpedance amplifier 302, CMFB circuit 300 can, therefore, be decoupled from wideband transimpedance amplifier 302 (and remain powered on) during times that wideband transimpedance amplifier 302 is powered off. CMFB circuit 300 remains on to maintain a feedback loop capacitance $C_L$ at an approximately normal operating voltage. In one implementation, switches 316A-316B, 318A-318B decouple CMFB circuit 300 from wideband transimpedance amplifier 302. Switches 316A-316B, 318A-318B can be implemented with CMOS transmission gates.

Error amplifier A2 adjusts a direct voltage (DC) operating point at outputs of wideband transimpedance amplifier 300 by supplying feedback voltage 314 to the gates of resistive current mirror transistors M32, M33, M34, M35. Resistive current mirror transistors M32, M33, M34, M35 control a loading on output stage 308. Resistive current mirror transistors M32, M33, M34, M35 can be sized to have a different width-to-length ratio than that of first feedback transistor $M_R$. For example, resistive current mirror transistor M34 can be sized relative to first feedback transistor $M_R$ as follows:

$$M34 = k(M_R) \quad \text{(eq. 3)}$$

where k is a predetermined ratio (e.g., 5). In addition, resistor $R_R$ (in CMFB circuit 300) can have a value that is proportional to resistor R8 as follows:

$$R_R = kR8 \quad \text{(eq. 4)}$$

By sizing resistive current mirror transistor M34 accordingly, error amplifier A2 can maintain a smaller current $I_C$ while controlling a relatively larger output current $I_O$ flowing through output transistor M31. Thus, current mirror 310 can bias CMFB circuit 300 (e.g., through transistor M22) with a lower current than an associated differential amplifier (e.g., wideband transimpedance amplifier 302). Current $I_C$ has a value that is proportional to output current $I_O$ as follows:

$$I_C = \frac{I_O}{k} \quad \text{(eq. 5)}$$

Figure 4:
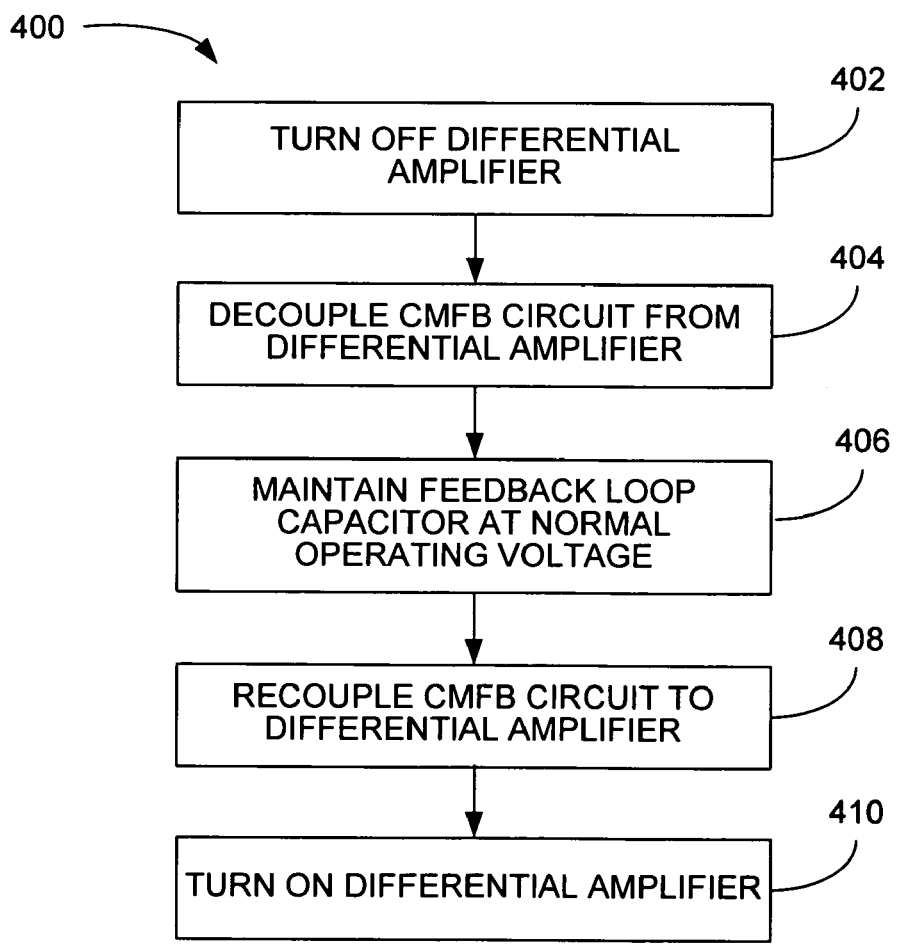
FIG. 4 illustrates a process for controlling a common mode voltage of a differential amplifier that has been powered down.

FIG. 4 shows a method 400 for controlling a CMFB circuit associated with a differential amplifier. The differential amplifier is turned off (step 402). The CMFB circuit is decoupled from the differential amplifier (step 404). In one implementation, the CMFB circuit is decoupled from the differential amplifier through switches. The CMFB circuit remains on to maintain a feedback loop capacitor in the CMFB circuit at approximately a normal operating voltage (step 406). At an appropriate time, the CMFB circuit is recoupled to the differential amplifier (step 408). The differential amplifier is turned on (step 410). The feedback loop capacitor is, therefore, operating at approximately near a normal operating voltage when the differential amplifier is turned on, resulting in a reduced settling time for the differential amplifier.

Figure 5:
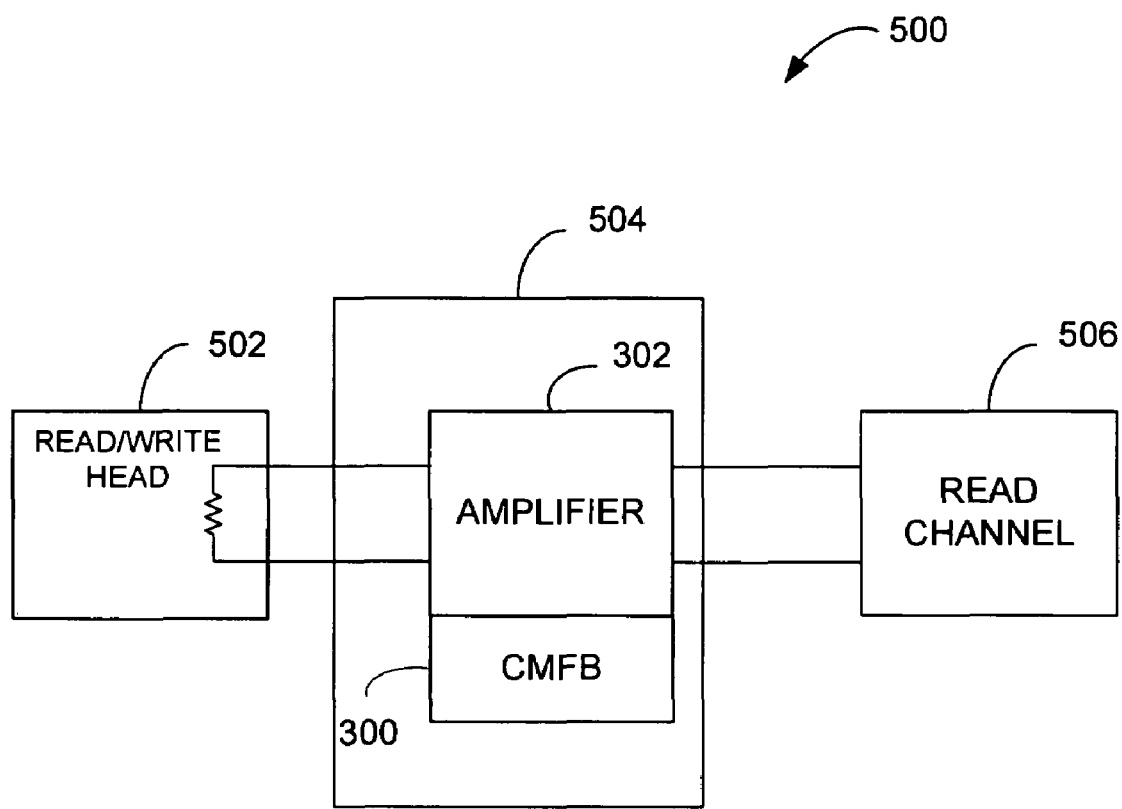
FIG. 5 is a block diagram of a wireless transceiver.

CMFB circuit 300 and wideband transimpedance amplifier 302 can be employed in a wide range of applications, for example, as a preamplifier in a disk drive system 500, as shown in FIG. 5. Disk drive system 500 can include a read/write head 502, a preamplifier 504, a read channel 506, and a variety of disk control circuitry (not shown) to control the operation of a hard disk drive. Preamplifier 504 includes wideband transimpedance amplifier 302 including CMFB 300, and may be implemented as a single integrated circuit, or as separate integrated circuits including a read preamplifier and a write preamplifier (or write driver).

In a read operation, an appropriate sector of a disk (not shown) is located and data that has been previously written to the disk is detected. Read/write head 502 senses changes in magnetic flux and generates a corresponding analog read signal. Preamplifier 504 receives and amplifies the analog read signal. The amplified analog read signal is provided to read channel 506. Read channel 506 conditions the amplified analog read signal and, in one implementation, detects "zeros" and "ones" from the signal to generate a digital read signal. Read channel 506 may condition the digital read signal by further amplifying the digital read signal to an appropriate level using, for example, automatic gain control (AGC) techniques. Read channel 506 may then filter the amplified digital read signal to eliminate unwanted high frequency noise, perform data recovery, and format the digital read signal. The digital read signal can be transferred from read channel 506 and stored in memory (not shown).

Various implementations have been described. Nevertheless, it will be understood the various modifications may be made without departing from the spirit and scope of the invention. For example, FIG. 3 depicts a two-stage amplifier, however, CMFB circuit 300 can be used with an n-stage amplifier, where n is a predetermined number. Also, error amplifier A2 can maintain current $I_C$ by comparing a reference current source to an operating current flowing through a node in CMFB 300. Accordingly, other implementations are within the scope of the following claims.

What is claimed is:

1. An amplifier, comprising:
   an input stage configured to receive an input;
   an amplification stage coupled to the input stage, the amplification stage configured to amplify the input and generate a differential amplified output, the differential amplified output having an associated common mode voltage level; and
   a common mode feedback circuit coupled to the amplification stage, the common mode feedback circuit configured to control the common mode voltage level using a feedback loop, the common mode feedback circuit configured to remain energized when the amplification stage is de-energized.

2. The amplifier of claim 1, wherein the input is a single-ended input.

3. The amplifier of claim 1, wherein the input is a differential input.

4. The amplifier of claim 1, further comprising a switch operable to decouple the common mode feedback circuit from the amplification stage to allow the common mode feedback circuit to remain energized when the amplification stage is de-energized.

5. The amplifier of claim 1, wherein the feedback loop includes an error amplifier, the error amplifier configured to:
   compare a reference voltage to an operating voltage of a node in the common mode feedback circuit; and
   supply a feedback voltage to the amplification stage based on the comparison to control the common mode voltage level.

6. The amplifier of claim 1, further comprising a current mirror, the current mirror configured to bias the common mode feedback circuit with a current similar to a current in the amplification stage of the amplifier.

7. The amplifier of claim 6, wherein the current mirror is configured to bias the common mode feedback circuit with a lower current than the amplification stage of the amplifier.

8. The amplifier of claim 7, wherein the current mirror is configured to bias the common mode feedback circuit substantially as follows:

$$I_C = \frac{I_O}{k};$$

where $I_C$ represents bias current for the common mode feedback circuit, and $I_O$ represents bias current for the amplification stage of the amplifier, and k is a predetermined ratio.

9. A method for controlling a common mode voltage level associated with an output of a differential amplifier, the method comprising:
   amplifying an input signal and generating an amplified output signal, the amplified output signal having an associated common mode voltage level;
   generating a common mode feedback voltage through a feedback loop, the common mode feedback voltage controlling the common mode voltage level;
   adjusting the common mode voltage level based on the common mode feedback voltage;
   discontinuing amplification of the input signal; and
   while discontinuing amplification of the input signal, continuing to generate the feedback voltage through the feedback loop.

10. The method of claim 9, wherein the feedback voltage maintains a feedback loop capacitance at approximately an operating voltage level while the amplification of the input signal is discontinued.

11. The method of claim 10, further comprising re-continuing amplification of the input signal, wherein the amplification of the input signal has a reduced settling time due to the feedback loop capacitance being at approximately an operating voltage level.

12. An amplifier, comprising:
   means for receiving an input;
   amplifying means for amplifying the input and generating a differential amplified output, the differential amplified output having an associated common mode voltage level; and
   controlling means for controlling the common mode voltage level through a feedback loop, wherein the controlling means is configured to remain energized when the amplifying means is de-energized.

13. The amplifier of claim 12, wherein the input is a single-ended input.

14. The amplifier of claim 12, wherein the input is a differential input.

15. The amplifier of claim 12, further comprising a switching means for decoupling the controlling means from the amplifying means.

16. The amplifier of claim 12, wherein the feedback loop includes comparing means for comparing a reference voltage to an operating voltage of a node in the controlling means, and supplying a feedback voltage to the amplifying means based on the comparison to control the common mode voltage level.

17. The amplifier of claim 12, further comprising biasing means for biasing the controlling means with a current similar to a current in the amplifying means.

18. The amplifier of claim 17, wherein the biasing means is configured to bias the controlling means with a lower current than the amplifying means.

19. The amplifier of claim 18, wherein the biasing means is configured to bias the controlling means substantially as follows:

$$I_C = \frac{I_O}{k},$$

where $I_C$ represents bias current for the controlling means, and $I_O$ represents bias current for the amplifying means, and k is a predetermined ratio.

20. An amplifier, comprising:

an input stage configured to receive an input;

an amplification stage coupled to the input stage, the amplification stage configured to amplify the input and generate a differential amplified output having an associated common mode voltage level; and a common mode feedback circuit configured to control the common mode voltage level, the common mode feedback circuit configured to remain powered on when the amplification stage is powered off.

* * * * *